United States Patent
Bohannon et al.

(10) Patent No.: US 11,490,042 B2
(45) Date of Patent: Nov. 1, 2022

(54) CTIA IMAGE SENSOR PIXEL

(71) Applicant: Sony Semiconductor Solutions Corporation, Kanagawa (JP)

(72) Inventors: Eric Bohannon, Henrietta, NY (US); Hirotaka Murakami, Santa Clara, CA (US); Christopher Urban, Fairport, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 64 days.

(21) Appl. No.: 17/122,231

(22) Filed: Dec. 15, 2020

(65) Prior Publication Data

US 2022/0191422 A1    Jun. 16, 2022

(51) Int. Cl.
*H04N 5/3745* (2011.01)
*H01L 27/146* (2006.01)

(52) U.S. Cl.
CPC ... *H04N 5/37457* (2013.01); *H01L 27/14612* (2013.01); *H01L 27/14636* (2013.01)

(58) Field of Classification Search
CPC .......... H04N 5/37457; H01L 27/14612; H01L 27/14636
See application file for complete search history.

(56) References Cited

U.S. PATENT DOCUMENTS

| | | | |
|---|---|---|---|
| 6,958,623 B2* | 10/2005 | Congdon | H03K 17/687 326/119 |
| 7,557,848 B2* | 7/2009 | Koyama | H04N 5/378 257/292 |
| 7,683,953 B1 | 3/2010 | Merrill | |
| 2003/0042406 A1* | 3/2003 | Charbon | H04N 5/379 348/E3.021 |
| 2008/0018763 A1 | 1/2008 | Sato | |
| 2010/0282946 A1 | 11/2010 | Yin et al. | |
| 2011/0068860 A1* | 3/2011 | Baud | G01J 1/46 330/7 |
| 2012/0105695 A1* | 5/2012 | Iida | H04N 5/363 348/301 |
| 2013/0329853 A1* | 12/2013 | Coln | G06G 7/186 378/19 |
| 2020/0260026 A1* | 8/2020 | Ono | H01L 27/14645 |

FOREIGN PATENT DOCUMENTS

WO    WO-2019078110 A1 *    4/2019    ....... H01L 27/14603

OTHER PUBLICATIONS

International Search Report and Written Opinion dated Nov. 16, 2021 for corresponding International Application No. PCT/US2021/045234.

* cited by examiner

*Primary Examiner* — Padma Haliyur
(74) *Attorney, Agent, or Firm* — Michael Best & Friedrich LLP

(57) ABSTRACT

An image sensor and pixel circuit therefor includes a photoelectric conversion device; an amplifier including a first input terminal connected to the photoelectric conversion device, and an output terminal; a capacitor disposed between the first input terminal and the output terminal; and a reset switch network disposed between the first input terminal and the output terminal in parallel with the capacitor, the reset switch network including at least a first reset transistor, a second reset transistor, and a third reset transistor.

18 Claims, 4 Drawing Sheets

CTIA IMAGE SENSOR PIXEL

BACKGROUND OF THE INVENTION

1. Field of the Invention

This application relates generally to image sensors. More specifically, this application relates to a system and method for implementing a capacitive transimpedance amplifier (CTIA) pixel circuit architecture in image sensing applications.

2. Description of Related Art

Image sensing devices typically consist of an image sensor, generally implemented as an array of pixel circuits, as well as signal processing circuitry and any associated control or timing circuitry. Within the image sensor itself, charge is collected in a photoelectric conversion device of the pixel circuit as a result of the impingement of light.

Some existing pixel circuits implement a complementary metal-oxide-semiconductor (CMOS) architecture, in which the transfer of the charge within the pixel circuit and/or to downstream circuitry (e.g., signal processing circuitry) is controlled using one or more metal-oxide-semiconductor field-effect transistors (MOSFETs). A CTIA pixel circuit is one example of a pixel circuit which implements the CMOS architecture.

A CTIA pixel circuit may implement a capacitor and a reset switch which resets the pixel circuit (e.g., by reinitializing the charge on the capacitor) between integrations. An ideal reset switch would present infinite impedance when open, and thus would not conduct any current. However, practical circuit components may conduct leakage current even when the switch is open. This leakage current may be problematic in operating the pixel circuit. In particular, the leakage current may be integrated onto the capacitor and consume dynamic range and/or result in integral non-linearity (INL) degradation.

These effects may lead to low gain in the pixel circuit. Thus, it may be difficult to build a high conversion-gain CTIA pixel circuit. For example, a larger conversion gain may be realized by using a capacitor having a relatively-small capacitance. However, if the capacitance is too small, the effects of the leakage current may become large. These problems may also be exacerbated as integration time increases.

Therefore, there exists a need for a CTIA pixel circuit that is robust to the effects of potential leakage currents and that may implement a linear fixed-biased high conversion gain.

BRIEF SUMMARY OF THE INVENTION

Various aspects of the present disclosure relate to an image sensor, readout circuit therefor, and calibration method thereof.

In one aspect of the present disclosure, there is provided a pixel circuit comprising: a photoelectric conversion device; an amplifier including a first input terminal connected to the photoelectric conversion device, and an output terminal; a capacitor disposed between the first input terminal and the output terminal; and a reset switch network disposed between the first input terminal and the output terminal in parallel with the capacitor, the reset switch network including at least a first reset transistor, a second reset transistor, and a third reset transistor.

In another aspect of the present disclosure, there is provided an image sensor comprising: a pixel circuit configured to generate a pixel circuit, the pixel circuit including a photoelectric conversion device, an amplifier including a first input terminal connected to the photoelectric conversion device, and an output terminal, a capacitor disposed between the first input terminal and the output terminal, and a reset switch network disposed between the first input terminal and the output terminal in parallel with the capacitor, the reset switch network including at least a first reset transistor, a second reset transistor, and a third reset transistor; a vertical signal line configured to convey the pixel signal from the pixel circuit; and signal processing circuitry configured to receive the pixel signal via the vertical signal and to perform at least one signal processing operation on the pixel signal.

In this manner, the above aspects of the present disclosure provide for improvements in at least the technical field of imaging, as well as the related technical fields of signal processing, image processing, and the like.

This disclosure can be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as flowcharts, data tables, and system configurations. It will be readily apparent to one skilled in the art that these specific details are merely exemplary and not intended to limit the scope of this application.

Moreover, while the present disclosure focuses mainly on examples in which the processing circuits are used in image sensors, it will be understood that this is merely one example of an implementation. It will further be understood that the disclosed systems and methods can be used in any device in which there is a need to reduce noise in a signal processing or other analog circuit; for example, an audio signal processing circuit, industrial measurement and systems, and the like. Furthermore, the image sensor implementations described below may be incorporated into an electronic apparatus, including but not limited to a smartphone, a tablet computer, a laptop computer, and the like.

Image Sensor

Figure 1:
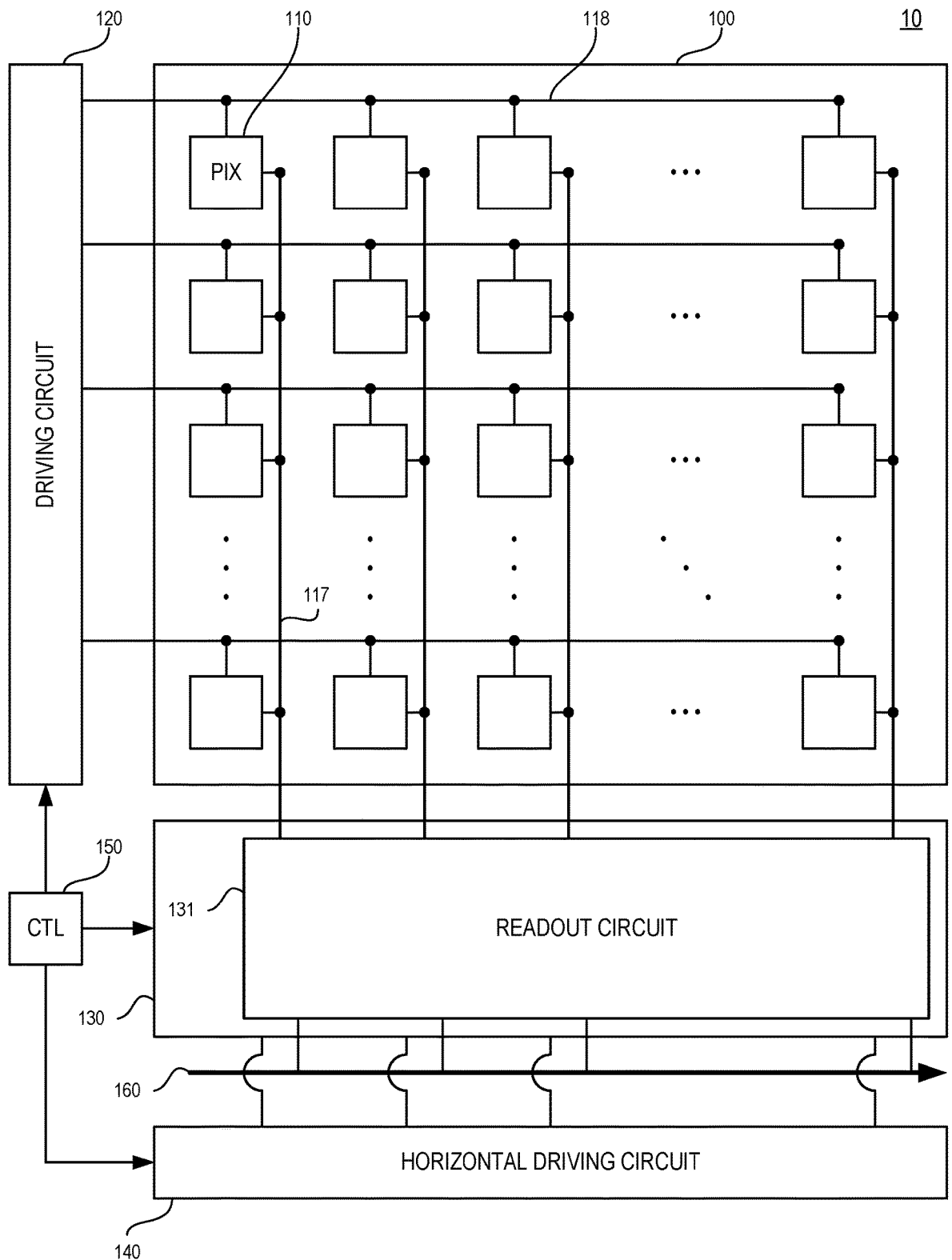
FIG. 1 illustrates an exemplary image sensor according to various aspects of the present disclosure.

FIG. 1 illustrates an image sensor 10 according to various aspects of the present disclosure. Image sensor 10 includes an array 100 of pixel circuits 110. The pixel circuits 110 are located at intersections where horizontal signal lines 118 and vertical signal lines 117 cross one another. The horizontal signal lines 118 are operatively connected to a vertical driving circuit 120, also known as a "row scanning circuit," at a point outside of the pixel array 100, and carry signals from the vertical driving circuit 120 to a particular row of the pixel circuits 110. Pixels in a particular column output an analog signal corresponding to an amount of incident light to the vertical signal line 117. For illustration purposes, only a subset of the pixel circuits 110 are actually shown in FIG. 1; however, in practice the image sensor 10 may have up to tens of millions of pixel circuits ("megapixels" or MP) or more.

The vertical signal line 117 conducts the analog signal for a particular column to a column circuit 130, also known as a "signal processing circuit." While FIG. 1 illustrates one vertical signal line 117 for each column in the pixel array 100, the present disclosure is not so limited. For example, more than one vertical signal line 117 may be provided for each column, or each vertical signal line 117 may correspond to more than one column. In any case, the column circuit 130 preferably includes a readout circuit 131, which may include a plurality of individual sub-circuits and is also known collectively as "readout and ADC circuits". The column circuit 130 including the readout circuit 131 may include various components such as one or more analog amplifiers, ADCs, S/H circuits, and the like. The column circuit is configured to perform one or more signal processing operations on a signal received via the vertical signal line 117, including but not limited to an amplifying operation, an analog-to-digital conversion operation, a sampling operation, a correlated double sampling (CDS) operation, a pixel binning operation, a pixel thinning operation, an output operation, and the like.

CTIA Pixel Circuits

Figure 2A:
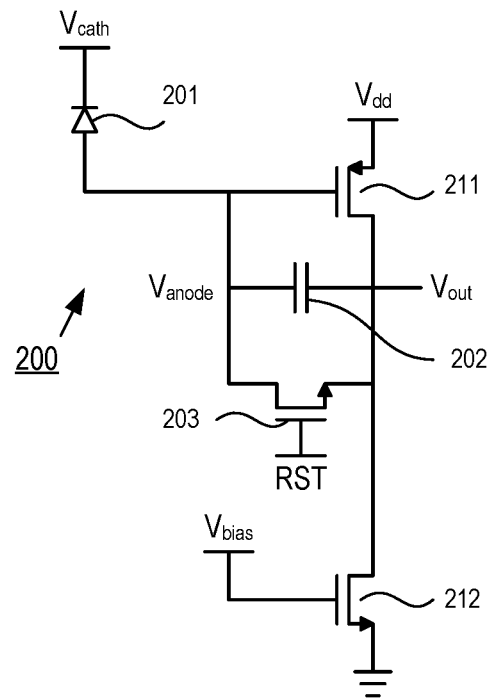
FIGS. 2A-B illustrate exemplary pixel circuits according to a comparative example.
Figure 2B:
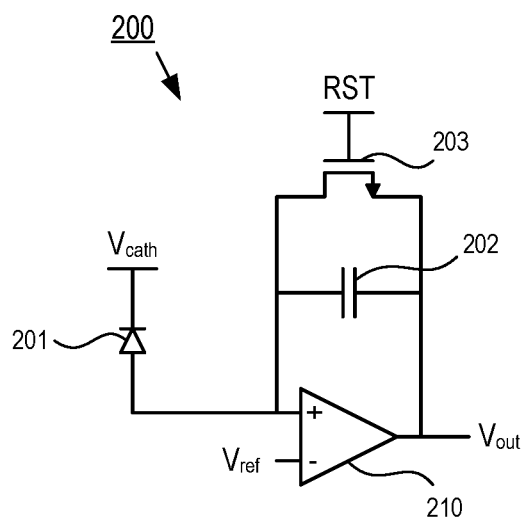

FIGS. 2A-B respectively illustrate an exemplary pixel circuit 200 in accordance with the present disclosure, which implements a CTIA architecture. FIG. 2A illustrates the pixel circuit 200 as a single-ended input implementation, whereas FIG. 2B illustrates the pixel circuit 200 as an differential amplifier implementation. The pixel circuit 200 is one example of the pixel circuit 110 illustrated in FIG. 1.

The pixel circuit 200 includes a photoelectric conversion device 201 (e.g., a photodiode), a feedback capacitor 202, and a reset transistor 203. The pixel circuit 200 further includes a differential amplifier 210 in the differential amplifier implementation, and further includes a first amplifier transistor 211 and a second amplifier transistor 212 in the single-ended input implementation. The pixel circuit 200 integrates a charge on the photoelectric conversion device 201, and outputs a signal $V_{out}$ indicative of the charge. A non-inverting terminal of the differential amplifier 210 is operatively connected to an anode electrode of the photoelectric conversion device 201, and an inverting terminal of the differential amplifier 210 receives a reference voltage $V_{ref}$. The signal $V_{out}$ may be output to the appropriate vertical signal line 117 illustrated in FIG. 1. While not illustrated in the particular example of FIGS. 2A-B, the pixel circuit 200 may include one or more additional transistors, such as a selection transistor between the output of the pixel circuit 200 and the vertical signal line 117. Moreover, while FIGS. 2A-2B illustrate n-type MOS (NMOS) transistors, the pixel circuit 200 may be implemented using p-type MOS (PMOS) transistors or using a combination of NMOS and PMOS transistors.

The reset switch discussed above is implemented as the signal reset transistor 203 in FIGS. 2A-B. A gate terminal of the reset transistor 203 receives a reset signal RST, and the reset transistor 203 is either in an open state or a closed state depending on the value of the control signal RST at a given time. In practice, the reset transistor 203 conducts leakage current from a source terminal thereof to a drain terminal thereof, even when the control signal RST is such that the reset transistor 203 is in the open state. The leakage current, integrated onto the feedback capacitor 202, may flow through the feedback capacitor 202 and into the drain-to-body junction on the reset transistor 203. This drain-to-body current flow exists because the junction may not be zero-biased.

In operation, the pixel circuit 200 has two main operating states: a reset state and an integration state. During the reset state, the reset transistor 203 is in the closed state and the voltage $V_{anode}$ on the feedback capacitor 202 takes an appropriate value such that the first amplifier transistor 211 sources the current sunk by the second amplifier transistor 212. The voltage $V_{cath}$ is applied globally to the cathode electrodes of the photoelectric conversion device 201 in all pixel circuits 200 in the image sensor 10. During these operating states, the leakage current may flow through the feedback capacitor 202 as described above.

During the integration state, the reset transistor 203 is in the open state and current from the photoelectric conversion device 201 is integrated across the feedback capacitor 202. In this state, the first amplifier transistor 211 may have an inherent gate-to-drain capacitance that is effectively in parallel with the capacitance of the feedback capacitor 202. This may result in a voltage-dependent conversion gain.

To address the effects of leakage current through the reset switch, an implementation using a reset switch network will be described in more detail below. To address the INL issue caused by voltage-dependent conversion gain, a cascode transistor may be added. An implementation using a cascode transistor will be described in more detail below.

Reset Switch Network

Figure 3:
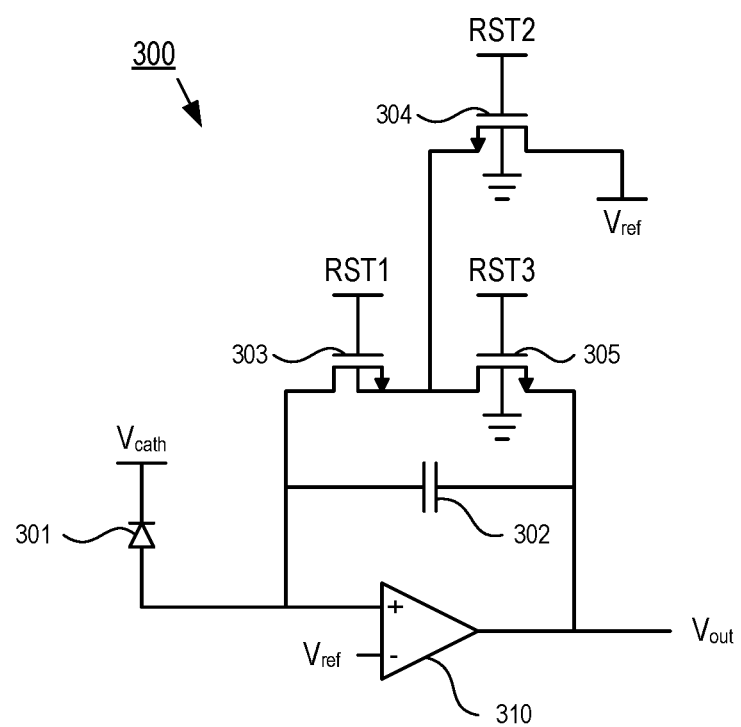
FIG. 3 illustrates an exemplary pixel circuit according to various aspects of the present disclosure.

FIG. 3 illustrates an exemplary pixel circuit 300 having a CTIA architecture and which implements a reset switch network. The pixel circuit 300 is one example of the pixel circuit 110 illustrated in FIG. 1.

Compared with the pixel circuit 200 illustrated in FIGS. 2A-B, the pixel circuit 300 replaces the single reset transistor 200 with a three-transistor reset switch network. In particular, the pixel circuit 300 includes a photoelectric conversion device 301 (e.g., a photodiode), a feedback capacitor 302, a first reset transistor 303, a second reset transistor 304, a third reset transistor 305, and a differential amplifier 310. The pixel circuit 300 integrates a charge on the photoelectric conversion device 301, and outputs a signal $V_{out}$ indicative of the charge. A non-inverting terminal of the differential amplifier 310 is operatively connected to an anode electrode of the photoelectric conversion device 301, and an inverting terminal of the differential amplifier 310 receives a reference voltage $V_{ref}$. The signal $V_{out}$ may be output to the appropriate vertical signal line 117 illustrated in FIG. 1. While not illustrated in the particular example of FIG. 3, the pixel circuit 300 may include one or more additional transistors, such as a selection transistor between the output of the pixel circuit 300 and the vertical signal line 117. Moreover, while FIG. 3 illustrates NMOS transistors, the pixel circuit 300 may be implemented using PMOS transistors or using a combination of NMOS and PMOS transistors.

In the reset switch network, a body terminal of the first reset transistor 303 is connected to a source terminal of the first reset transistor 303, and respective body terminals of the second reset transistor 304 and the third reset transistor 305 are grounded. The first reset transistor 303 and the third reset transistor 305 are connected in series across the electrodes of the feedback capacitor 302, such that the source terminal of the first reset transistor 303 is connected to a drain terminal of the third reset transistor 305. A source terminal of the second reset transistor 304 is connected to a node between the first reset transistor 303 and the third reset transistor 305. A drain terminal of the second reset transistor is connected to the reference voltage $V_{ref}$. Each of the transistors in the reset switch network operates under the control of a corresponding control signal, such that a gate terminal of the first reset transistor 303 receives a first reset signal RST1, a gate terminal of the second reset transistor 304 receives a second reset signal RST2, and a gate terminal of the third reset transistor 305 receives a third reset signal RST3.

During an integration state of the pixel circuit 300, the reset signals RST1-RST3 have respective values such that the first reset transistor 303 is in the open state, the second reset transistor 304 is in the closed state, and the third reset transistor 305 is in the open state. In this state, the leakage current is minimized because, ignoring the offset voltage of the differential amplifier 310, the respective voltages on all terminals of the first reset transistor 303 are equal. Because the first reset transistor 303 is source-body tied, the junction component of the leakage current is minimized. This may result in an increased conversion pixel circuit of up to 60 µV/e⁻.

During a reset state of the pixel circuit 300, the reset signals RST1-RST3 have respective values such that the first reset transistor 303 is in the closed state, the second reset transistor 304 is in the open state, and the third reset transistor 305 is in the closed state. This effectively places the circuit in a unity-gain mode, such that the reference voltage $V_{ref}$ is passed to the output. In order to account for systematic offset in the differential amplifier 310, it may instead be possible to pass a voltage other than the reference voltage $V_{ref}$ in this state. Moreover, in some implementations, when transitioning from the reset state to the integration state, the first reset transistor 303 may be opened before the second reset transistor 304 closes and the third reset transistor 305 opens. This timing may minimize charge injection.

In addition to the three reset transistors illustrated in FIG. 3, additional components may be utilized. For example, a fourth reset transistor may be provided, wherein a drain terminal of the fourth reset transistor is connected to the node between the first reset transistor 303 and the third reset transistor 305, a source terminal of the fourth reset transistor is connected to a voltage $V_{lag}$, and a gate terminal of the fourth reset transistor receives a control signal LAG. A similar modification is described in more detail with reference to the cascode transistor implementation below. Moreover, while FIG. 3 illustrates a differential amplifier implementation, the pixel circuit 300 may be implemented as a single-ended input circuit, in which case a dummy pixel may be provided to create the equivalent $V_{ref}$ voltage.

Cascode Transistor

Figure 4:
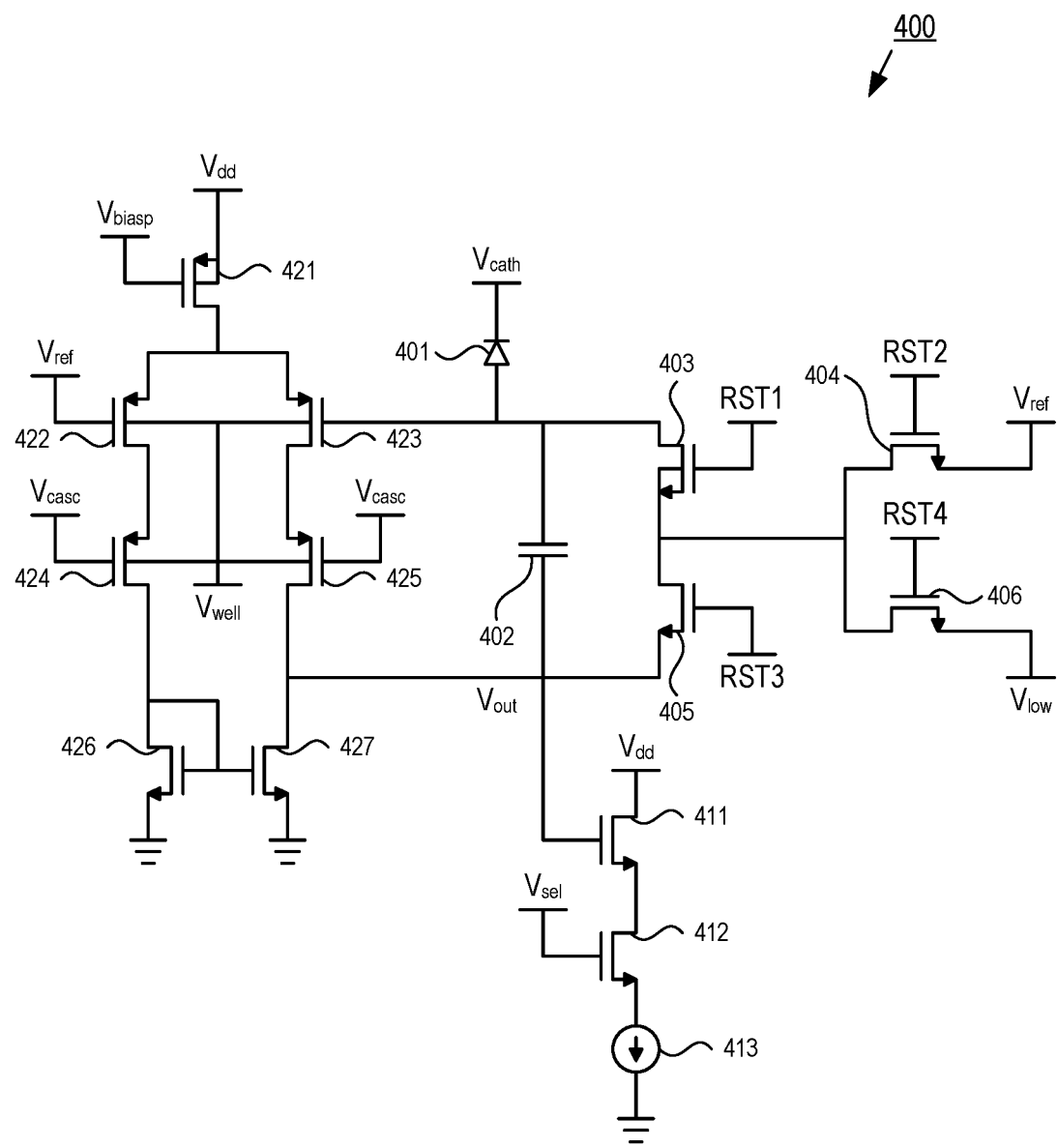
FIG. 4 illustrates another exemplary pixel circuit according to various aspects of the present disclosure.

FIG. 4 illustrates an exemplary pixel circuit 400 having a CTIA architecture and which implements a reset switch network. The pixel circuit 400 is one example of the pixel circuit 110 illustrated in FIG. 1.

The pixel circuit 400 includes a photoelectric conversion device 401 (e.g., a photodiode); a feedback capacitor 402; a reset switch network including a first reset transistor 403, a second reset transistor 404, a third reset transistor 405, and a fourth reset transistor 406; a source-follower including a source-follower transistor 411 and a selection transistor 412; and a differential amplifier including a tail transistor 421, a first input transistor 422, a second input transistor 423, a first cascode transistor 424, a second cascode transistor 425, a first mirror transistor 426, and a second mirror transistor 427. The pixel circuit 400 integrates a charge on the photoelectric conversion device 401, and outputs a signal $V_{out}$ indicative of the charge. In some modified implementations, the pixel circuit 400 may omit some components, such as the selection transistor 412. Moreover, in some implementations the reset switch network may be replaced with three reset transistors in a manner similar to the illustration of FIG. 3 or with a single reset transistor in a manner similar to the illustration of FIG. 2.

As illustrated in FIG. 4, the first reset transistor 403, the second reset transistor 404, the third reset transistor 405, the fourth reset transistor 406, the source-follower transistor 411, the selection transistor 412, the first mirror transistor 426, and the second mirror transistor 427 are implemented as NMOS transistors; whereas the tail transistor 421, the first input transistor 422, the second input transistor 423, the first cascode transistor 424, and the second transistor 425 are implemented as PMOS transistors. In practice, however, these conductivity types are not limiting and various ones of the transistors may be implemented using a different conductivity type than that illustrated in FIG. 4.

In the reset switch network of FIG. 4, a body terminal of the first reset transistor 403 is connected to a source terminal of the first reset transistor 403. While not particularly illustrated in FIG. 4, respective body terminals of the second reset transistor 404, the third reset transistor 405, and/or the fourth reset transistor 406 may be grounded. The first reset transistor 403 and the third reset transistor 405 are connected in series across the electrodes of the feedback capacitor 402, such that the source terminal of the first reset transistor 403 is connected to a drain terminal of the third reset transistor 405. A source terminal of the second reset transistor 404 and a source terminal of the fourth reset transistor 406 are connected to a node between the first reset transistor 403 and the third reset transistor 405. A drain terminal of the second reset transistor 404 is connected to the reference voltage $V_{ref}$. A drain terminal of the fourth reset transistor 406 is connected to a lag control voltage $V_{low}$. Each of the transistors in the reset switch network operates under the control of a corresponding control signal, such that a gate terminal of the first reset transistor 403 receives a first reset signal RST1, a gate terminal of the second reset transistor 404 receives a second reset signal RST2, and a gate terminal of the third reset transistor 405 receives a third reset signal RST3, and a gate terminal of the fourth reset transistor 406 receives a fourth signal RST4. In some implementations of a detector including the pixel circuit 400, the detector may require a larger bias in order to reset the pixel circuit 400 and/or to reset charges entirely. In such implementations, the fourth reset transistor 406 is used to apply a larger bias to the photoelectric conversion device 401.

In the source-follower of FIG. 4, the source-follower transistor 411, the selection transistor 412, and a current source 413 are disposed in series between a power supply voltage $V_{dd}$ and ground. A gate of the selection transistor 412 receives a selection signal $V_{sel}$ to selectively turn the selection transistor 412 on or off. A gate of the source-follower transistor 411 receives the output $V_{out}$ at a gate terminal thereof and selectively allows a current to flow via the current source 413, depending on the value of the output $V_{out}$ and the state of the selection transistor 412. The source-follower transistor 411 and the selection transistor 412 are not strictly required, but may help reduce the settling time if implemented.

In the differential amplifier, a body terminal of the tail transistor 421 is connected to a source terminal of the tail transistor 421. In the particular illustration of FIG. 4, respective body terminals of the first input transistor 422, the second input transistor 423, the first cascode transistor 424, and the second cascode transistor 425 are commonly connected with one another and with a well voltage $V_{well}$. The voltage $V_{well}$ is not strictly required to have a particular voltage level, but may be appropriately selected for power supply rejection (PSR) reasons if desired. In alternative implementations, the respective body terminals may be connected to the corresponding source terminals of the transistors or may be connected to the power supply voltage $V_{dd}$. While not particularly illustrated in FIG. 4, respective body terminals of the first mirror transistor 426 and/or the second mirror transistor 427 may be grounded. The source terminal and body terminal of the tail transistor 421 are connected to the power supply voltage $V_{dd}$. On one side of the differential amplifier, the first input transistor 422, the first cascode transistor 424, and the first mirror transistor 426 are connected in series between a drain terminal of the tail transistor 421 and ground. On the other side of the differential amplifier, the second input transistor 423, the second cascode transistor 425, and the second mirror transistor 427 are connected in series between the drain terminal of the tail transistor 421 and ground. A drain terminal of the first mirror transistor 426 is connected to a gate terminal thereof, such that the first mirror transistor 426 is diode-connected. The gate terminal of the first mirror transistor 426 and a gate terminal of the second mirror transistor 427 are connected to one another, thereby to form a current mirror. A gate terminal of the tail transistor 421 receives a biasing signal $V_{biasp}$, a gate terminal of the first input transistor 422 receives the reference voltage $V_{ref}$, a gate terminal of the second input transistor 423 is connected to the feedback capacitor 402 and the photoelectric conversion device 401, and respective gate terminals of the first cascode transistor 424 and the second cascode transistor 425 receive a cascode signal $V_{casc}$.

During an integration state of the pixel circuit 400, the reset signals RST1-RST3 have respective values such that the first reset transistor 403 is in the open state, the second reset transistor 404 is in the closed state, and the third reset transistor 405 is in the open state. In this state, the leakage current is minimized because, ignoring the offset voltage of the differential amplifier 410, the respective voltages on all terminals of the first reset transistor 403 are equal. Because the first reset transistor 403 is source-body tied, the junction component of the leakage current is minimized. Additionally, in this state, the second cascode transistor 425 isolates the anode of the photoelectric conversion device 401 (and thus the gate of the second input transistor 423) from the output of the amplifier. This reduces the LDD-induced voltage-dependent conversion gain and thus allows for a linear high conversion-gain CTIA pixel circuit. The second cascode transistor 425 also increases the gain of the amplifier such that the anode changes to a lesser degree during integration. This results in the photoelectric conversion device 401 being closer to fixed-biased relative to a comparative circuit which does not include the second cascode transistor 425.

During a CTIA reset state of the pixel circuit 400, the reset signals RST1-RST3 have respective values such that the first reset transistor 403 is in the closed state, the second reset transistor 404 is in the open state, and the third reset transistor 405 is in the closed state. This effectively places the circuit in a unity-gain mode, such that the reference voltage $V_{ref}$ is passed to the output (ignoring offset voltage). The offset may be minimized by appropriately sizing the first input transistor 422, the second input transistor 423, the first mirror transistor 426, and the second input transistor 427. If the voltage $V_{cath}$ on the cathode of the photoelectric conversion device 401 is equal to the reference voltage $V_{ref}$, the photoelectric conversion device 401 is fixed-biased during the reset operation.

In some implementations, a photoelectric conversion device reset state may be implemented prior to the CTIA reset state of the pixel circuit 400. In this state, the reset signals RST1-RST4 have respective values such that the first reset transistor 403 is in the closed state, the second reset transistor 404 is in the open state, the third reset transistor 405 is in the open state, and the fourth reset transistor 406 is in the closed state.

The pixel circuit 400 implements a cascode transistor layout to increase the gain and to reduce or eliminate INL degradation. For example, a cascoded common-source transistor implementation has larger gain than a single transistor common-source implementation. In particular, the cascoded implementation has a gain of approximately $(g_m \times r_o)^2$ whereas the single transistor implementation has a gain of approximately $(g_m \times r_o)$, where $g_m$ represents the transconductance of the transistor and $r_o$ represents the output resistance of the transistor.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A pixel circuit, comprising:
   a photoelectric conversion device;
   an amplifier including a first input terminal electrically connected to the photoelectric conversion device, and an output terminal;
   a capacitor disposed between the first input terminal and the output terminal; and
   a reset switch network disposed between the first input terminal and the output terminal in parallel with the capacitor, the reset switch network including at least a first reset transistor, a second reset transistor, and a third reset transistor, wherein
   the first reset transistor and the third reset transistor are connected in series between the first input terminal and the output terminal, and
   one of a source terminal or a drain terminal of the second reset transistor is connected to a node between the first reset transistor and the third reset transistor.

2. The pixel circuit according to claim 1, wherein the amplifier includes a second input terminal configured to receive a reference voltage.

3. The pixel circuit according to claim 1, wherein the reset switch network includes a fourth reset transistor.

4. The pixel circuit according to claim 1, wherein the other of the source terminal or the drain terminal of the second reset transistor is connected to a predetermined voltage.

5. A pixel circuit, comprising:
   a photoelectric conversion device;
   an amplifier including a first input terminal electrically connected to the photoelectric conversion device, and an output terminal;
   a capacitor disposed between the first input terminal and the output terminal; and
   a reset switch network disposed between the first input terminal and the output terminal in parallel with the capacitor, the reset switch network including at least a first reset transistor, a second reset transistor, and a third reset transistor, wherein
   during a reset state of the pixel circuit, the first reset transistor is in a closed state, the second reset transistor is in an open state, and the third reset transistor is in a closed state, and
   during an integration state of the pixel circuit, the first reset transistor is in an open state, the second reset transistor is in a closed state, and the third reset transistor is in an open state.

6. The pixel circuit according to claim 1, wherein the amplifier includes a first cascode transistor and a second cascode transistor.

7. The pixel circuit according to claim 6, wherein
   the amplifier includes a first input transistor, a gate terminal of the first input transistor being connected to the photoelectric conversion device, and
   the first cascode transistor is connected between the first input transistor and the output terminal.

8. The pixel circuit according to claim 7, wherein the amplifier includes a second input transistor, a gate terminal of the second input transistor being configured to receive a reference voltage.

9. The pixel circuit according to claim 1, further including a source-follower transistor, wherein a gate terminal of the source-follower transistor is connected to the output terminal.

10. The pixel circuit according to claim 9, further comprising a selection transistor connected between the source-follower transistor and an output of the pixel circuit.

11. The pixel circuit according to claim 1, wherein the first reset transistor, the second reset transistor, and the third reset transistor are NMOS transistors.

12. The pixel circuit according to claim 1, wherein the first reset transistor, the second reset transistor, and the third reset transistor are PMOS transistors.

13. An image sensor comprising:
   a pixel circuit configured to generate a pixel signal, the pixel circuit including:
      a photoelectric conversion device,
      an amplifier including a first input terminal electrically connected to the photoelectric conversion device, and an output terminal,
      a capacitor disposed between the first input terminal and the output terminal, and
      a reset switch network disposed between the first input terminal and the output terminal in parallel with the capacitor, the reset switch network including at least a first reset transistor, a second reset transistor, and a third reset transistor;
   a vertical signal line configured to convey the pixel signal from the pixel circuit; and
   signal processing circuitry configured to receive the pixel signal via the vertical signal and to perform at least one signal processing operation on the pixel signal, wherein
   the first reset transistor and the third reset transistor are connected in series between the first input terminal and the output terminal, and
   one of a source terminal or a drain terminal of the second reset transistor is connected to a node between the first reset transistor and the third reset transistor.

14. The image sensor according to claim 13, wherein the amplifier includes a second input terminal configured to receive a reference voltage.

15. The image sensor according to claim 13, wherein the other of the source terminal or the drain terminal of the second reset transistor is connected to a predetermined voltage.

16. The image sensor according to claim 13, wherein the amplifier includes a first cascode transistor and a second cascode transistor.

17. The image sensor according to claim 16, wherein
   the amplifier includes a first input transistor, a gate terminal of the first input transistor being connected to the photoelectric conversion device, and the first cascode transistor is connected between the first input transistor and the output terminal.

18. The image sensor according to claim 17, wherein the amplifier includes a second input transistor, a gate terminal of the second input transistor being configured to receive a reference voltage.

\* \* \* \* \*